(12) United States Patent
Martiel et al.

(10) Patent No.: US 11,042,685 B2
(45) Date of Patent: Jun. 22, 2021

(54) METHOD FOR DEVELOPING A PROCESS FOR COMPILING A QUANTUM CIRCUIT ON A QUANTUM PROCESSOR AND SUCH PROCESS

(71) Applicant: BULL SAS, Les Clayes-sous-Bois (FR)

(72) Inventors: Simon Martiel, Bezons (FR); Arnaud Gazda, Bezons (FR)

(73) Assignee: BULL SAS, Les Clayes-sous-Bois (FR)

( * ) Notice: Subject to any disclaimer, the term of this patent is extended or adjusted under 35 U.S.C. 154(b) by 0 days.

(21) Appl. No.: 16/727,026

(22) Filed: Dec. 26, 2019

(65) Prior Publication Data

US 2020/0218847 A1  Jul. 9, 2020

(30) Foreign Application Priority Data

Dec. 26, 2018  (FR) ...................................... 1874179

(51) Int. Cl.
*G06F 30/398*    (2020.01)
*G06F 30/392*    (2020.01)
(Continued)

(52) U.S. Cl.
CPC .......... *G06F 30/398* (2020.01); *G06F 30/367* (2020.01); *G06F 30/392* (2020.01); *G06N 10/00* (2019.01)

(58) Field of Classification Search
CPC .... G06F 30/398; G06F 30/391; G06F 30/367; G06N 10/00
See application file for complete search history.

(56) References Cited

U.S. PATENT DOCUMENTS

2007/0241770 A1* 10/2007 Rohe ................ H03K 19/17796
                                                 326/38
2019/0121921 A1*  4/2019 Nam ..................... G06N 10/00
(Continued)

OTHER PUBLICATIONS

Correspondence from the French National Institute of Industrial Property Office (INPI—Institute National De La Propriété Industrielle) for FR1874179 dated Nov. 14, 2019; Preliminary Research Report of the French National Institute of Industrial Property Office for FR1874179 dated Nov. 11, 2019; and Written Opinion on the Patentability of the Invention issued by the French National Institute of Industrial Property Office for FR1874179.
(Continued)

*Primary Examiner* — Vuthe Siek
(74) *Attorney, Agent, or Firm* — Meagher Emanuel Laks Goldberg & Liao, LLP

(57) ABSTRACT

A method for developing a method for compiling a quantum circuit on a quantum processor, comprising:
  a selection step:
  of a quantum circuit,
  of a quantum processor whereupon to compile the quantum circuit,
  of a set of quantum gates that can be executed on the selected quantum processor,
  of a metric,
  a meta-heuristic,
  a step of division of the selected quantum circuit into quantum sub-circuits,
  a first step of re-writing of the quantum sub-circuits comprising quantum gates that cannot be executed by the selected quantum processor to comprise only quantum gates that can be executed by the selected quantum processor,
  a second step of re-writing of the quantum sub-circuits, by the selected meta-heuristic, to obtain quantum sub-
(Continued)

circuits comprising quantum gates that can be executed by the selected quantum processor, improving the selected metric, a step of regrouping of the quantum sub-circuits in a quantum circuit compilable by the selected quantum processor.

20 Claims, 7 Drawing Sheets

(51) Int. Cl.
  *G06F 30/367* (2020.01)
  *G06N 10/00* (2019.01)
  *G06N 5/00* (2006.01)

(56) References Cited

U.S. PATENT DOCUMENTS

2019/0362270 A1* 11/2019 Haener ............... G06F 30/327
2020/0184024 A1* 6/2020 Nam .................. G06F 30/327

OTHER PUBLICATIONS

Haener, T., Steiger, D.S., Svore, K. Troyer, M., 'A software methodology for compiling quantum programs', 2018, Quantum Science and Technology, vol. 3, No. 2, pp. 1-18, DOI: 10.1088/2058/-9565/aaa5cc.

Maslov, D., Dueck, G.W., Miller, D.M., Negrevergne, C., 'Quantum Circuit Simplification and Level Compaction', 2008, Cornell University Library, pp. 1-13, DOI: 10.1109/TCAD.2007.911334.

Zulehner, A., Wille, R., 'Compiling SU(4) Quantum Circuits to IBM QX Architectures', 2018, CORR (ARXIV), vol. 1808.05661, No. v2, pp. 1-6, XP055637837.

Martinez, E.A., Monz, T., Nigg, D., Schindler, P., Blatt, R., 'Compiling quantum algorithms for architectures with multi-qubit gates', 2016, New Journal of Physics, Institute of Physics Publishing, vol. 18, No. 6, 63029, pp. 1-13, DOI: 10.1088/1367-2630/18/6/063029.

Arabzadeh, M., Saeedi, M., Zamani, M.S., 'Rule-based optimization of reversible circuits', 2010, Design Automation Conference (ASP-DAC), 2010 15th Asia and South Pacific, IEEE, pp. 849-854, XP031641265.

* cited by examiner

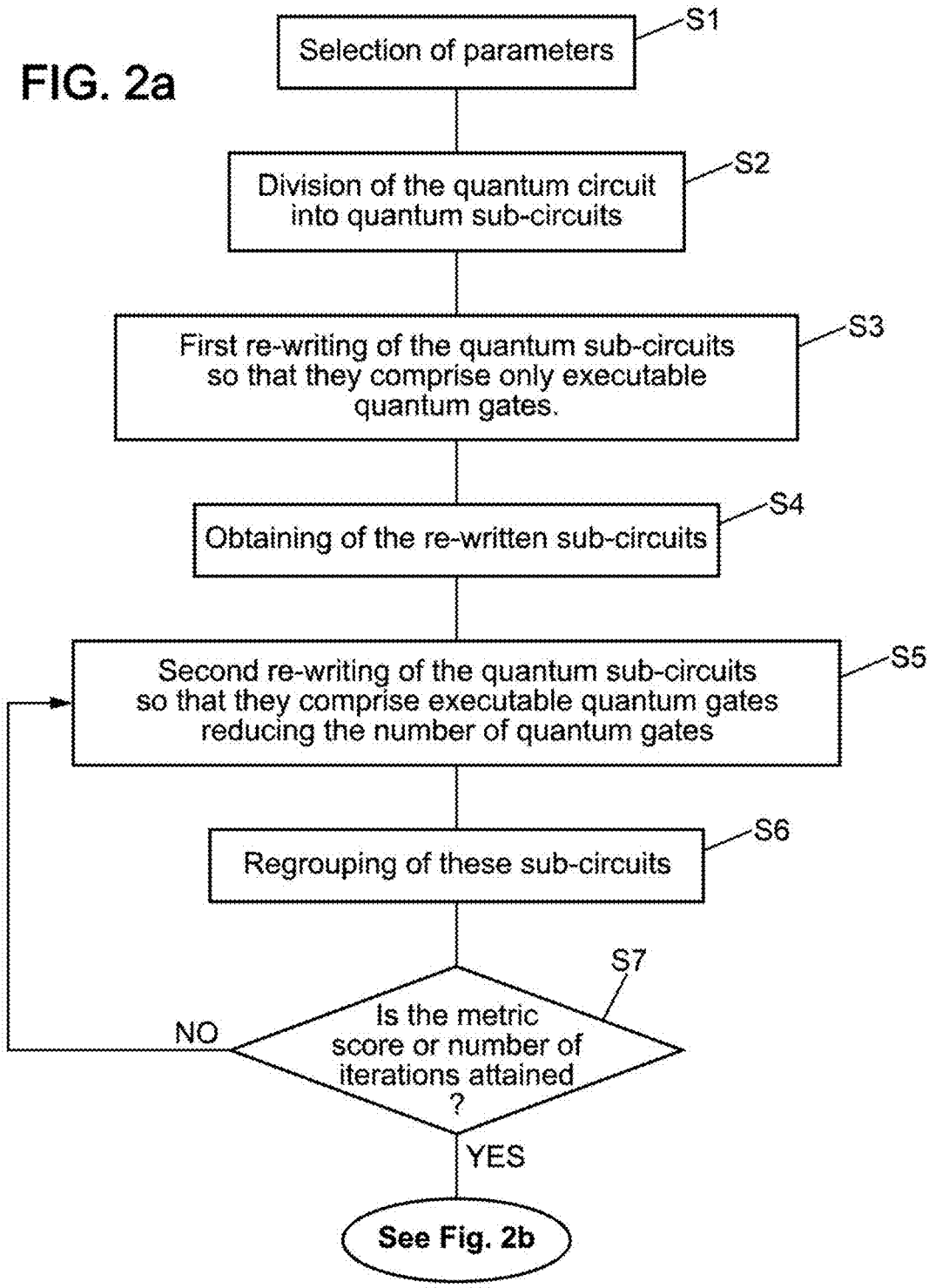

Algorithm 1: Local optimization changes_possible : = list<gain, right member, left member> init(changes_possible)

*while* change_local_possible() :
    sort_by_gain_decreasing(changes_possible)

*for* member_right, member_left in changes_possible :
        replace(member_left, member_right)

METHOD FOR DEVELOPING A PROCESS FOR COMPILING A QUANTUM CIRCUIT ON A QUANTUM PROCESSOR AND SUCH PROCESS

CROSS-REFERENCE TO RELATED APPLICATIONS

This application claims the benefit of French Patent Application No. 1874179 filed Dec. 26, 2018, the disclosure of which is herein incorporated by reference in its entirety.

TECHNICAL FIELD

The invention relates to the field of methods for development of a compiling method for a quantum circuit on a quantum processor and methods for compiling a quantum circuit on a quantum processor.

PRIOR ART

A method from the document, Compiling SU(4) Quantum Circuits to IBM QX Architectures that allows to compile a quantum program on a fixed quantum processor. The method takes only certain changes into consideration, such as the insertion of quantum gates for value swap between two qubits and a Cartan decomposition. The method seeks to minimize the number of quantum gates in the resulting quantum circuit, using a heuristic.

However, this method does not make it possible to compile any quantum program on any quantum processor. In addition, this method is not an anytime method.

A method is also known from the document, Rule-based optimization of reversible circuits, that allows to replace quantum sub-circuits with optimal equivalent quantum sub-circuits.

However, this method only applies to reversible sub-circuits, and therefore has certain significant constraints.

Technical Problem

These known solutions do not, on the one hand, make it possible to propose a method capable of compiling any quantum circuit on any quantum processor or, on the other hand, make it possible, during the compilation of a quantum circuit, to propose a method for the optimization of the quantum circuit according to any optimization metric.

The invention is intended to reduce, at least partially, the number of problems of the prior art.

In order to do this, the invention proposes a method that allows for the compilation of any quantum circuit on any quantum processor, also allowing the optimization of the quantum circuit compilation. In order to do this, it will be beneficial to propose a selection step for a plurality of parameters comprising the quantum circuit, the quantum processor, a set of quantum gates, an optimization metric and a heuristic or meta-heuristic, making the optimization of the compilation possible.

The method therefore allows for a compilation with five degrees of freedom, thus making this method particularly adaptable, both in terms of compilation of quantum circuits, and in terms of optimization of the quantum circuit obtained.

To allow so much freedom without sacrificing the efficacy of the quantum circuit, the invention proposes, on the one hand, to re-write the quantum circuit, sub-circuit by sub-circuit, and on the other hand to firstly convert the non-executable gates into executable gates before optimizing the executable gates according to the selected metric.

A method is proposed for the development of a compiling method for a quantum circuit on a quantum processor, comprising:
  a selection step:
   of a quantum circuit,
   of a quantum processor whereupon to compile the quantum circuit,
   of a set of executable quantum gates on the selected quantum processor, based on the selected quantum processor,
   of an optimization metric,
   of a heuristic or meta-heuristic,
  a step of division of the selected quantum circuit into quantum sub-circuits,
  a first step of re-writing of the quantum sub-circuits comprising quantum gates that cannot be executed by the selected quantum processor so that they comprise only quantum gates that can be executed by the selected quantum processor,
  a second step of re-writing of the quantum sub-circuits according to the selected heuristic or meta-heuristic, in order to obtain quantum sub-circuits comprising quantum gates that can be executed by the selected quantum processor, improving the selected metric,
  a step of regrouping of the quantum sub-circuits in a quantum circuit compilable by the selected quantum processor.

In the second step of re-writing of the quantum sub-circuits, quantum gates that can be improved, for example by merging the two quantum gates into a single one, can also be replaced. This step of improvement, if better strictly locally, can be executed between the first and second re-writing steps. It is desirable to obtain executable and optimal gates, i.e. executable gates that are better strictly locally, i.e., if a trivial optimization exists (for example, the merging of two gates: RX(x) RX(y)→RX(x+y)" in the case where it is known that, regardless of which RX is executed, the improvement is obvious), we can execute this trivial optimization as soon as possible, or at any time.

Non-executable quantum gates should be understood as quantum gates that cannot be executed on the selected quantum processor, or quantum gates that are no longer to be kept.

A method for compiling a quantum circuit on a quantum processor is also proposed, by the use of a set of quantum gates that can be executed on the quantum processor, comprising:
  a step of division of the selected quantum circuit into quantum sub-circuits,
  a first step of re-writing of the quantum sub-circuits comprising quantum gates that cannot be executed by the selected quantum processor so that they comprise only quantum gates that can be executed by the selected quantum processor,
  a second step of re-writing of the quantum sub-circuits according to the selected heuristic or meta-heuristic, in order to obtain quantum sub-circuits comprising quantum gates that can be executed by the selected quantum processor, improving the selected metric,
  a step of regrouping of the quantum sub-circuits in a compiled quantum circuit.

Preferably, the second step of re-writing comprises:
an iteration loop subsequently comprising:
a step of obtaining of quantum sub-circuits resulting from the first step of re-writing, a step of re-writing of said quantum sub-circuits into quantum sub-circuits comprising quantum gates that can be executed by the processor improving the selected metric, a step of regrouping of the quantum sub-circuits to obtain a compilable quantum circuit, a retroaction step, via the selected heuristic or meta-heuristic, resulting in a new step of re-writing of the quantum sub-circuits resulting from the first step of re-writing based on a selected metric score associated with the compilable quantum circuit, to attain:
either an extreme score threshold for the metric selected,
or a maximum threshold of iterations in the loop.

Therefore, the use of an iteration loop during the application of the heuristic or meta-heuristic makes it possible to perform local de-optimizations in order to finally obtain a global optimization of the quantum circuit. In other words, the heuristic or meta-heuristic are used to avoid blind local optimizations, local optimizations that ultimately risk not resulting in the most optimal quantum circuit. Therefore, by sometimes choosing to locally increase the metric instead of systematically reducing it, the heuristic or meta-heuristic leads to a global optimization of the most important quantum circuit.

Preferably, a score equal to less than infinity is associated with the quantum gates that cannot be executed on the selected quantum processor, a score equal to zero or to another constant value is associated with the quantum gates that can be executed on the selected quantum processor.

Alternatively, another score may be associated with the quantum gates that cannot be executed. This score is, for example, strictly less than the score associated with the quantum gates that can be executed. The score equal to less than infinity makes it possible to immediately detect that a gate that cannot be executed is present in the quantum circuit.

Preferably, the heuristic or the meta-heuristic for optimization re-writes the quantum sub-circuits by:
changing the sequential order of the quantum gates of the quantum sub-circuits,
and/or replacing the two-qubit quantum gates or more than two qubits with one-qubit quantum gates.

Consideration could also be given to replacing the n-qubit quantum gates with n-p-qubit quantum gates, for example 4 or 5-qubit quantum gates with 2 or 3-qubit quantum gates.

The heuristic or meta-heuristic is also able to re-write the quantum sub-circuits by replacing two-qubit quantum gates or more than two qubits with one-qubit quantum gates, two qubits, or more than two qubits.

The heuristic or meta-heuristic is therefore able to perform different re-writing operations, thus making it possible to increase the selected metric.

Preferably, the selected heuristic or meta-heuristic is a simulated annealing.

Indeed, it appears that the use of a simulated annealing as a heuristic or meta-heuristic gives the best results in terms of optimization of the quantum circuit and increasing the selected metric.

Preferably, the maximum threshold of iterations in the loop is predetermined as a function of at least one selected quantum processor and/or quantum circuit.

This makes it possible to limit the number of iterations when a threshold of the metric is attained. Furthermore, since the method is an anytime method, it is possible to interrupt the iteration loop at any time by obtaining an optimized quantum circuit.

According to another aspect, a method is proposed for the development of a compiling method for a quantum circuit on a quantum processor, comprising:
a selection step:
of a quantum circuit,
of a quantum processor whereupon to compile the quantum circuit,
of a set of executable quantum gates on the selected quantum processor, based on the selected quantum processor,
a step of division of the selected quantum circuit into quantum sub-circuits,
a first step of re-writing of the quantum sub-circuits comprising quantum gates that cannot be executed by the selected quantum processor so that they comprise only quantum gates that can be executed by the selected quantum processor,
a second step of re-writing of the quantum sub-circuits by application of a simulated annealing, so as to obtain quantum sub-circuits comprising quantum gates that can be executed by the selected quantum processor, reducing the number of quantum gates,
a step of regrouping of the quantum sub-circuits in a quantum circuit compilable by the selected quantum processor.

A method for compiling a quantum circuit on a quantum processor is also proposed, by the use of a set of quantum gates that can be executed on the quantum processor, comprising:
a step of division of the selected quantum circuit into quantum sub-circuits,
a first step of re-writing of the quantum sub-circuits comprising quantum gates that cannot be executed by the selected quantum processor so that they comprise only quantum gates that can be executed by the selected quantum processor,
a second step of re-writing of the quantum sub-circuits by application of a simulated annealing, so as to obtain quantum sub-circuits comprising quantum gates that can be executed by the selected quantum processor, reducing the number of quantum gates,
a step of regrouping of the quantum sub-circuits in a compiled quantum circuit.

According to this embodiment, the metric and the heuristic or the meta-heuristic are determined. Indeed, it has been discovered that the use of a simulated annealing, in order to optimize a quantum circuit such that it comprises the lowest possible number of quantum gates, is particularly advantageous. In particular, this choice of metric and of heuristic or meta-heuristic leads to a particularly effective compilation of the quantum circuit, since the simulated annealing is ideal when it is a matter of obtaining a quantum circuit having a reduced number of quantum gates. In fact, this simulated annealing technique, due to its ability to de-optimize locally for better global optimization, makes it possible to more easily and more certainly obtain a global optimum, rather that remaining at a simple local optimum close to the initial configuration of the quantum circuit, which would be more difficult with other heuristics such as, for example, the gradient descent. Furthermore, this method can always be applied to any quantum program on any quantum processor.

Preferably, the second step of re-writing comprises:
an iteration loop subsequently comprising:
a step of obtaining of quantum sub-circuits resulting from the first step of re-writing, a step of re-writing of said quantum sub-circuits into quantum sub-circuits comprising quantum gates that can be executed by the processor and reducing the number of quantum gates, a step of regrouping of the quantum sub-circuits to obtain a compilable quantum circuit, a retroaction step, via the simulated annealing, resulting in a new step of re-writing of the quantum sub-circuits resulting from the first re-writing step based on the number of quantum gates in the compilable quantum circuit, to attain:

either an extreme score threshold for the metric selected,
or a maximum threshold of iterations in the loop.

Therefore, the use of an iteration loop during the application of the simulated annealing makes it possible to perform local de-optimizations in order to ultimately obtain a global optimization of the quantum circuit. In other words, the simulated annealing is used to avoid performing blind local optimizations, local optimizations that ultimately risk not resulting in the most optimal quantum circuit. Therefore, by sometimes choosing to locally increase the metric instead of systematically reducing it, the simulated annealing leads to a global optimization of the most important quantum circuit.

Preferably, the maximum threshold of iterations in the loop is predetermined, based on at least one selected quantum processor and/or quantum circuit.

This makes it possible to limit the number of iterations when a threshold of the metric is attained. Furthermore, since the method is an anytime method, it is possible to interrupt the iteration loop at any time by obtaining an optimized quantum circuit.

Preferably, a score equal to less than infinity is associated with the quantum gates that cannot be executed on the selected quantum processor, a score equal to zero or to another constant value is associated with the quantum gates that can be executed on the selected quantum processor.

Alternatively, another score may be associated with the quantum gates that cannot be executed. This score is, for example, strictly less than the score associated with the quantum gates that can be executed. The score equal to less than infinity makes it possible to immediately detect that a gate that cannot be executed is present in the quantum circuit.

Preferably, the simulated annealing re-writes the quantum sub-circuits by:
changing the sequential order of the quantum gates of the quantum sub-circuits,
and/or replacing the two-qubit quantum gates or more than two qubits with one-qubit quantum gates.

The simulated annealing is also able to re-write the quantum sub-circuits by replacing two-qubit quantum gates or more than two qubits with one-qubit quantum gates, two qubits, or more than two qubits.

The simulated annealing is therefore able to perform different re-writing operations, thus making it possible to increase the selected metric.

BRIEF DESCRIPTION OF THE DRAWINGS

Other characteristics, details and benefits of the invention will become apparent upon reading the detailed description below, and analysis of the annexed drawings, wherein:

FIG. 2a shows the main steps of the method and the compilation method of a quantum circuit on a quantum processor according to an embodiment of the invention.

DESCRIPTION OF THE EMBODIMENTS

Figure 1:
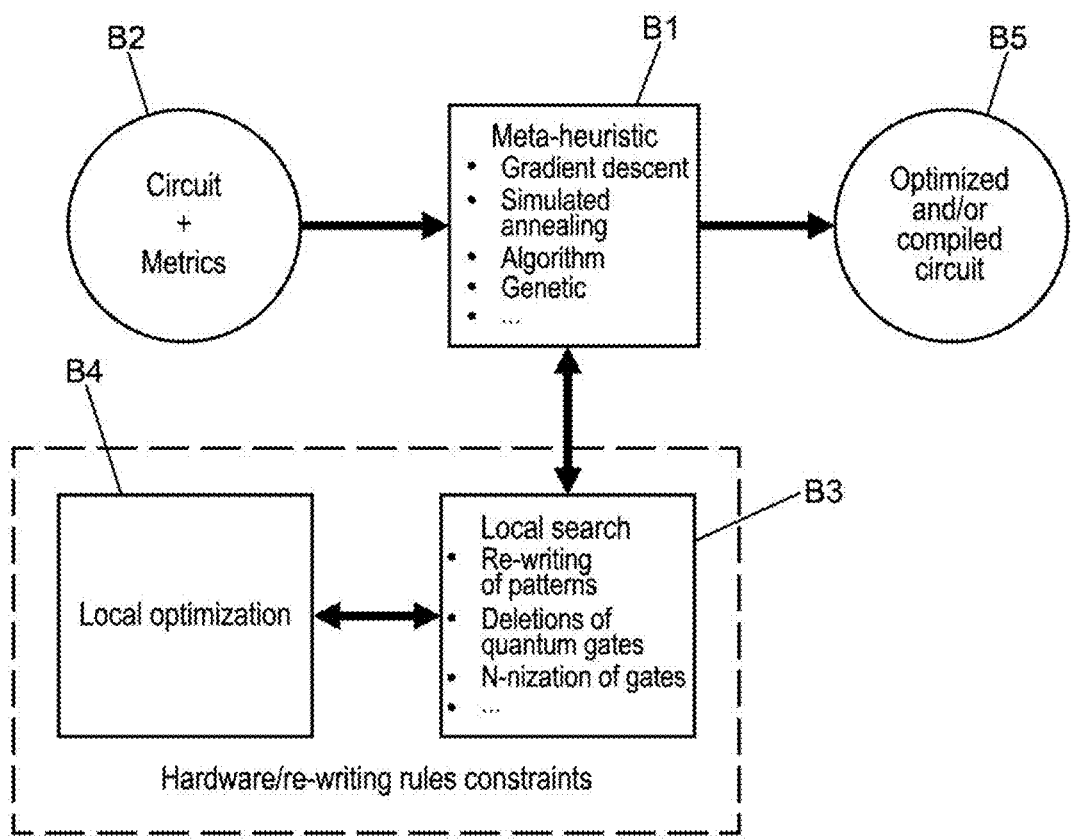
FIG. 1 shows a block diagram implemented by the method and the compilation method of a quantum circuit on a quantum processor according to an embodiment of the invention.

Reference is now made to FIG. 1. The method according to the invention makes it possible to compile any quantum circuit on any quantum processor.

To do this, the following problem must be solved:

$$\underset{C' \sim_R C}{\mathrm{argmax}}\; f(C') \qquad \text{[Math. 1]}$$

Where f is a selectable metric and $\sim_R$ is a binary relationship so that:

$$C' \sim_R C \Leftrightarrow C' \text{ can be obtained using } C \text{ by local change} \qquad \text{[Math. 2]}$$

A transformation $\rightarrow_L$ can additionally be defined, so that:

$$\rightarrow_L : C \rightarrow P(C) \qquad \text{[Math. 3]}$$

Being C a set of quantum circuits.

The problem can therefore be re-written so that $$\underset{C'}{\mathrm{argmax}}\; \{f(C') \mid C \rightarrow_L^* C'\} \qquad \text{[Math. 4]}$$

The method according to the invention makes it possible to select the desired metric f, and any local changes $\rightarrow_L$.

More specifically, the local changes make it possible to define rules for the re-writing of the quantum circuit so that it can be compilable on a selected quantum processor. The local changes are, for example, a set of quantum gates executable on the selected quantum processor.

The local changes can also comprise optimization rules, such as the insertion of quantum swap gates, as described below.

The method specifically uses a heuristic or meta-heuristic, shown by block B1 on FIG. 1.

The heuristic or meta-heuristic (hereinafter referred to as meta-heuristic) can also be selected. Particularly, the meta-heuristic can be selected from among a gradient descent, a simulated annealing or even a genetic algorithm.

The meta-heuristic receives in input a selected quantum circuit and a global metric as entries, shown by block B2. The global metric can specifically be selected to decrease the number of quantum gates in the obtained compilable quantum circuit. The meta-heuristic is intended to maximize the selected global metric.

To do this, the meta-heuristic additionally receives quantum sub-circuits provided by a local search as entries, corresponding to block B3.

The local search per se receives the selected quantum circuit as an entry. The local search is capable of effecting a separation of the quantum circuit into a plurality of sub-circuits and of determining equivalent quantum sub-circuits.

An equivalent quantum sub-circuit corresponds to a different quantum sub-circuit, which, however, produces the same effects, specifically with regard to quantum operations.

The equivalent sub-circuits are determined based on the authorized local changes, such as modifications of quantum gates that cannot be executed by the selected quantum processor into quantum gates that can be executed by said quantum processor.

More specifically, the local search B3 seeks an operation for the local modification of the quantum circuit. More specifically, a quantum sub-circuit is replaced by an equivalent quantum sub-circuit without considering the quantum circuit globally.

Therefore, this modification costs little, given the size of the quantum circuit.

At the end of this modification, a limited number of sub-circuits is returned to the meta-heuristic, since local search B3 only authorizes certain changes on sub-circuits, defined by the selected local changes. Therefore, the local search makes it possible to accelerate the meta-heuristic.

However, these re-writings of the quantum circuit into equivalent quantum sub-circuits may lead to a deterioration of the global metric.

Thus, a local optimization can be implemented by block B4. The local optimization detects the non-optimal quantum sub-circuits. A quantum sub-circuit is non-optimal if there is a strictly better equivalent quantum sub-circuit. The local optimization is intended to replace non-optimal quantum sub-circuits by optimal quantum sub-circuits.

The local optimization uses a noted score$l$. For a quantum sub-circuit, the higher the score, the more optimal the quantum sub-circuit.

The quantum circuit is to be modified since it only contains optimal sub-circuits, such as:

$$\forall C_1, C_2 \in C^2, \text{ if } C_1 \to_L C_2 \text{ and } l(C_1) \leq l(C_2) \text{ then} C_1 \to C_2 \quad \text{[Math. 5]}$$

The operator→means to replace the sub-circuits $C_1$ by $C_2$ in all sub-circuits found by the local search.

Local optimization makes local changes by decreasing gain. In other words, changes to high gains are made first. The gain is defined as the score difference between a quantum sub-circuit and an equivalent quantum sub-circuit:

$$\text{gain} = \text{score}_{local}(\text{right member}) - \text{score}_{local}(\text{left member}) \quad \text{[Math. 6]}$$

Figures 3, 4:
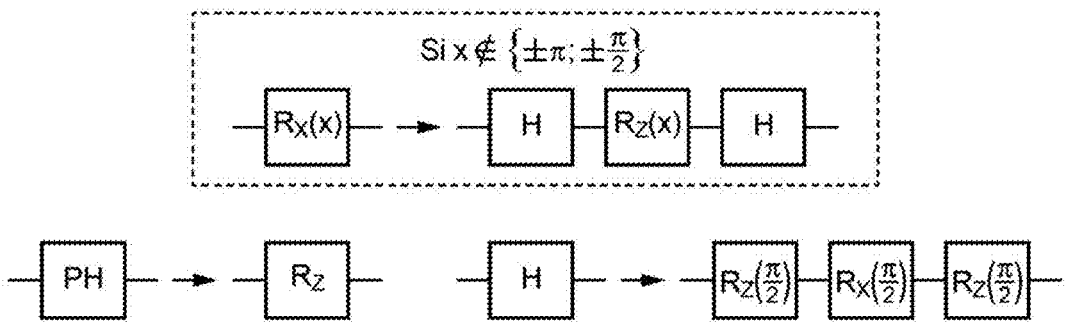
FIG. 3 shows a pseudo code used for the local optimization of a quantum circuit according to the method and the compilation method of a quantum circuit on a quantum processor according to an embodiment of the invention.
FIG. 4 shows an example of rules used for the re-writing of a quantum circuit according to the method and the method for compiling a quantum circuit on a quantum processor according to an embodiment of the invention.

FIG. 3 is a pseudo code used for the implementation of the local optimization. In this pseudo code, all of the selected local changes are documented. For each selected local change, the gains associated with the re-writing of each quantum sub-circuit by an optimal quantum sub-circuit are calculated and sorted in order to make the first re-writings for the highest associated gain.

These optimal quantum sub-circuits are then sent to the meta-heuristic (block B2), which re-writes the quantum circuit by replacing quantum sub-circuits by an optimal quantum sub-circuit with the goal of maximizing the global metric. Finally, in block B5, the optimized and compiled quantum circuit is obtained.

Figure 2B:
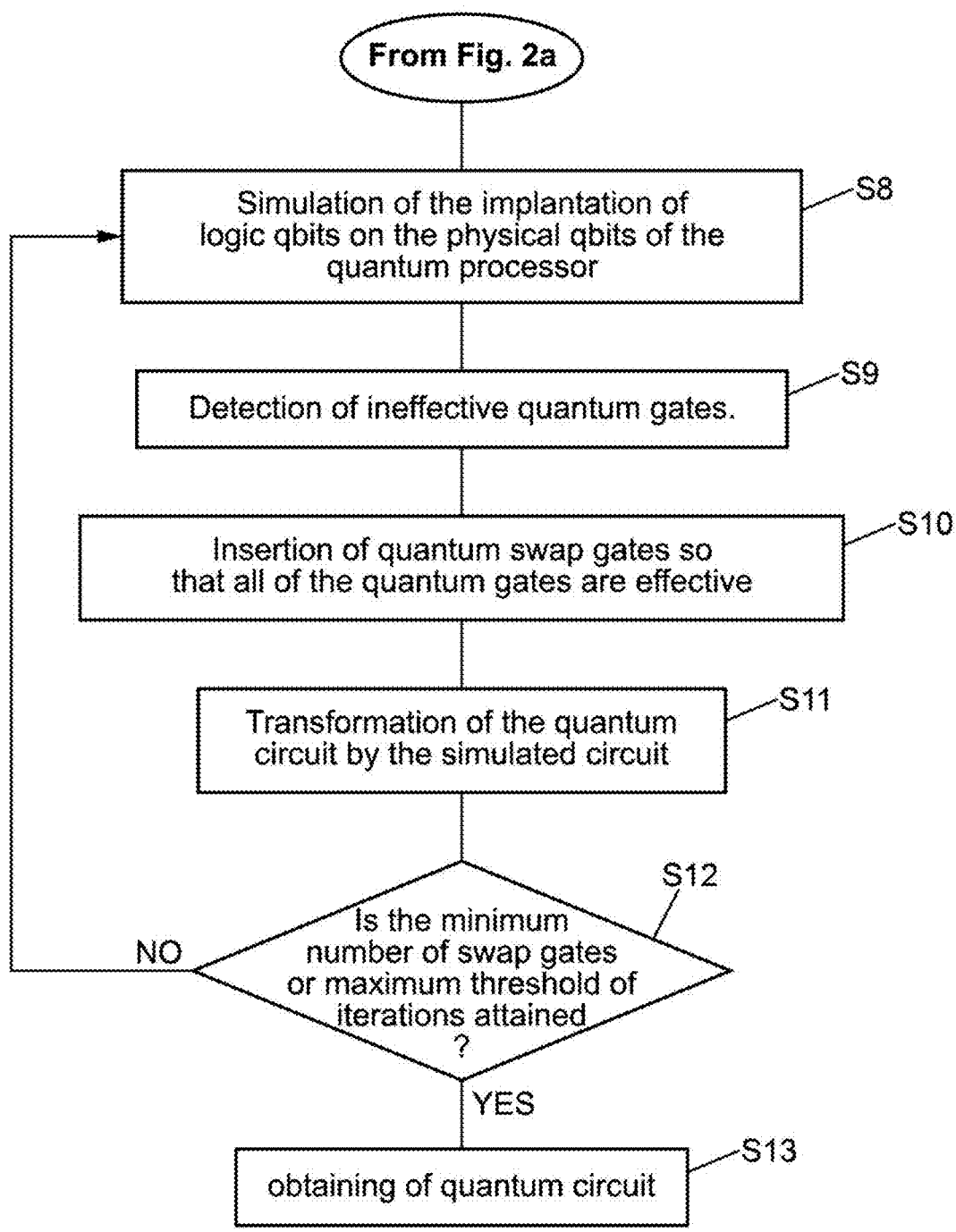
FIG. 2b shows the main steps of the method and the compilation method of a quantum circuit on a quantum processor according to an embodiment of the invention.

At this point, specific reference is made to FIGS. 2a and 2b, which depict the main steps of the method and process according to the invention.

A selection step S1 is implemented first. During the selection step S11, several elements are selected: a quantum circuit, a quantum processor whereupon compile the selected quantum circuit, a set of quantum gates that can be executed on the selected quantum processor, a metric to be maximized and a meta-heuristic.

In the following example of embodiment, the selected meta-heuristic is a simulated annealing.

Furthermore, the metrics target, on one hand, the reduction of the global number of quantum gates of the compiled circuit and, on the other hand, more specifically, the reduction of the number of quantum swap gates to be inserted in the quantum circuit so that it can be compilable.

A division step S2 of the quantum circuit into quantum sub-circuits is then carried out.

A first re-writing step S3 is implemented on these quantum sub-circuits. More specifically, the quantum sub-circuits comprising quantum gates non-executable by the selected quantum processor are re-written so that they comprise only quantum gates executable by the selected quantum processor.

Thus, the re-written quantum sub-circuits are obtained at the obtaining step S4.

The first step of re-writing of the quantum sub-circuits is implemented by the local search and local optimization shown by blocks B3 and B4 on FIG. 1.

A second re-writing step S5 of re-written quantum sub-circuits is then carried out. The second re-wriring step S5 is carried out by the simulated annealing, and is intended to maximize the global metric, defined herein as a minimization of the number of quantum gates of the quantum circuit.

At the step of regrouping S6, the quantum sub-circuits are regrouped in order to obtain a quantum circuit compilable by the quantum processor, In other words, all of the quantum gates present in this quantum circuit can be executed by the quantum processor.

Then, the simulated annealing determines, at the determination step S7, if the regrouped sub-circuits are optimal, i.e., that the score associated with the quantum circuit obtained at the step S6 attains a pre-determined threshold, or if the maximum number of iterations is obtained.

If this is not the case, the second re-writing step S5 is implemented again in order to further optimized the obtained quantum circuit.

Figure 5:
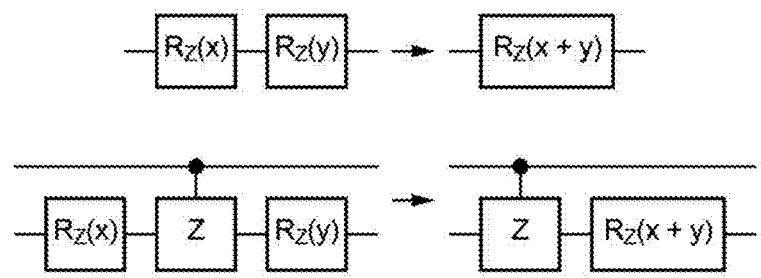
FIG. 5 shows an example of the rules used for the re-writing of a quantum circuit according to the method and the compilation method of a quantum circuit on a quantum processor according to an embodiment of the invention.
Figure 6:
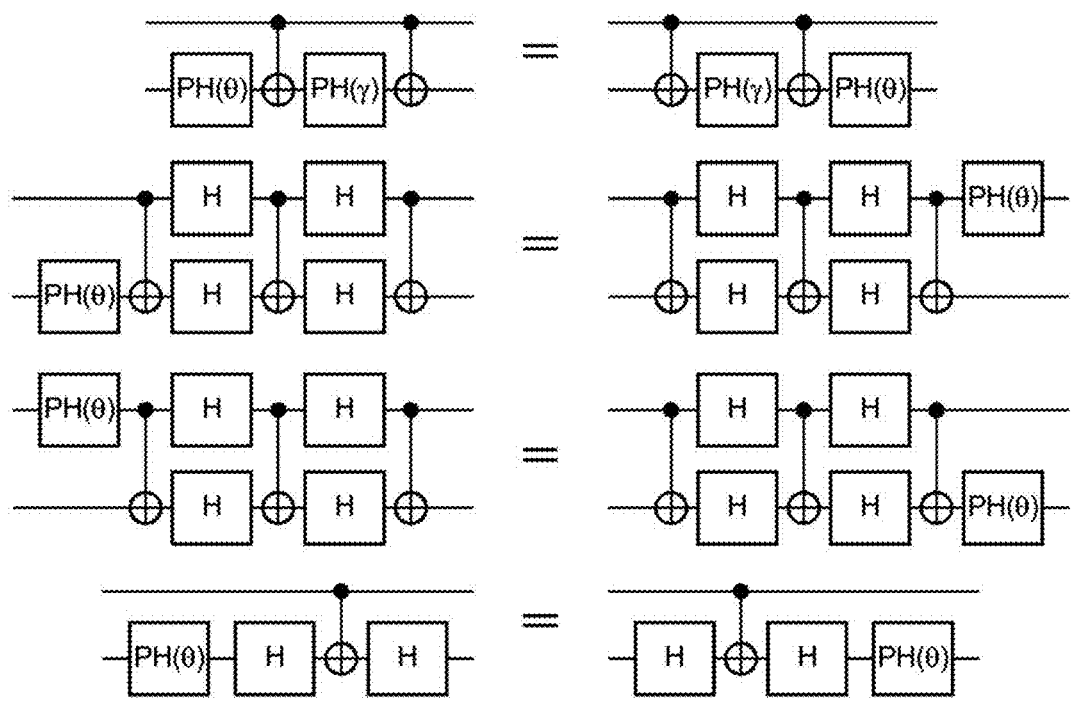
FIG. 6 shows an example of the rules used for the re-writing of a quantum circuit according to the method and the compilation method of a quantum circuit on a quantum processor according to an embodiment of the invention.
Figure 7:
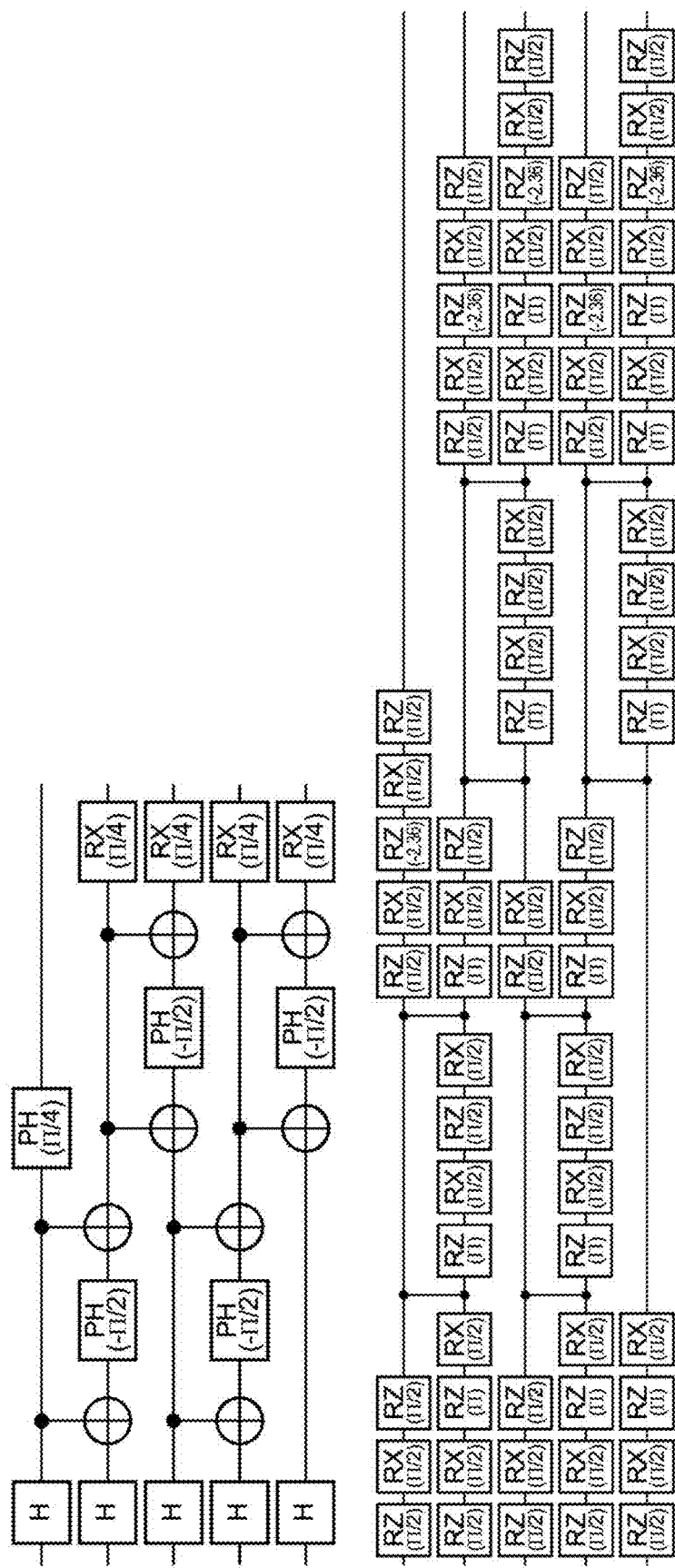
FIG. 7 shows an example of a quantum circuit complied using and original circuit according to rules used for the re-writing of a quantum circuit according to the method and the compilation method of a quantum circuit on a quantum processor according to an embodiment of the invention.

FIGS. 4 to 6 shows an example of quantum sub-circuits re-writing. Thus, local changes are defined so that the quantum sub-circuits (or quantum gates), which can be executed by the quantum processor and/or quantum sub-circuits (or quantum gates) that one wishes to save, have a score equal to zero or to any other constant value. The quantum sub-circuits (or quantum gates) that cannot be executed by the quantum processor and/or the quantum sub-circuits (or quantum gates) that are no longer to be kept have a score equal to minus infinite or to any other value strictly inferior to the score of the executable quantum sub-circuits.

Additionally, combinations of quantum gates that can be executed by the quantum processor can be defined to replace the quantum gates that cannot be executed.

For example, FIG. 4 shows an example wherein the selected quantum processor is capable of executing only quantum gates in rotation according to the Z Rz axis and according to the X Rx axis. Thus, the quantum gates in rotation according to the X Rx axis can be replaced by a combination of Hadamard H quantum gates, in rotation according to the Z Rz axis and Hadamard. A quantum gate PH can be replaced by a quantum gate in rotation according to the Z Rz axis, etc. In FIG. 4, all of the left members have a score equal to at least infinite and the right member has a score equal to zero. Thus, all of the left members are replaced by the right members during the first re-writing step S3.

Another example of rules is changing the order of the quantum gates, as shown in FIG. 6, where the quantum gates are the same between the left and right sub-circuits of the Figure, only the order of the quantum gates is modified.

Furthermore, in order to comply with the metric intending to reduce the number of quantum gates, other rules are followed. For example, two identical successive quantum gates can be merged in order to become a single quantum gate, as shown in FIG. 5. This makes it possible to maximize the selected metric.

All of these rules are applied by the local search and the local optimization, the blocks B3 and B4, in order to locally optimize the quantum circuit. However, these re-written sub-circuits are reprocessed by the simulated annealing (block B1), which seeks to optimize the global metric of the circuit, i.e., to reduce the number of quantum gates. Thus, during the iteration of steps S5 to S7, the simulated annealing can choose to re-write a sub-circuit decreasing the local metric of the circuit but maximizing the global metric of the quantum circuit. The use of the simulated annealing is, therefore, particularly advantageous.

FIG. 6 shows an optimized compiled quantum circuit, obtained as output from determination step S7. This quantum circuit comprises only quantum gates that can be executed by the selected quantum processor, or Rz and Rx gates, while it initially comprised quantum gates H, CNOT and PH.

Once this compiled and optimized quantum circuit is obtained, a second optimization can be implemented.

This relates to making it possible for qubits to interact therebetween. In order to do this, it is possible to exchange the value of two qubits in order to draw together the qubits to be made to interact, thus making the interaction possible. Quantum swap gates can therefore be added to the circuit, in order to exchange the value of two qubits.

The metric used can be modified. In this example, the selected metric is intended to obtain a quantum circuit comprising a minimum of quantum swap gates.

In step S8, the local search (block B3) conducts a simulation of the implementation of the logical qubits of the quantum circuit obtained in step S7 on the physical qubits of the selected quantum processor.

In step S9, this same local search detects the ineffective quantum gates in the quantum circuit. An ineffective quantum gate should be understood as a quantum gate that is to interact between two qubits and yet is unable to do so due to the fact that the qubits are not neighbors, or that they are quantum gates that are no longer to be kept.

A local metric can then be defined. Specifically, the local score of an effective quantum gate is defined as depending on the number of quantum swap gates inserted in the quantum circuit. The score can then be equal to the number of quantum swap gates present in the quantum circuit. A quantum gate acting on two non-neighboring qubits has a local score equal to at least the infinite or strictly inferior to the score associated with an effective quantum gate.

This local metric makes it possible to have a quantum circuit for which all of the quantum gates act on two neighboring qubits and therefore, for which all of the quantum gates of the quantum circuit are effective.

It is also possible to force the local metric to process the gates in a particular order (the first gates first, for example) by slightly changing the local metric.

Additionally, it is possible to improve the method by observing the impact of the simulation of the simulation step S8 on the following qubits.

The rules of the metric make it possible to define where the quantum swap gates can be inserted into the quantum circuit. The quantum circuit can therefore be transformed in order to move the qubits of one quantum gate closer, i.e., to insert a swap gate into the quantum circuit and renumber the qubits of the quantum circuit since the swap gates change the order of the qubits.

At the insertion step S10, the quantum swap gates are inserted into the quantum circuit so that all of the quantum gates of the circuit are effective. A transformation step S11 of the quantum circuit is then implemented. The simulated annealing effects a global optimization of the circuit in order to comply with the global metric, i.e., to minimize the number of quantum swap gates. In order to do this, the sub-parts of the quantum circuit can be re-written, for example, by following the rules for local changes authorized by the quantum processor, in order to delete quantum swap gates.

Quantum swap gates are inserted by the local search and the local optimization, blocks B3 and B4, in order to locally optimize the quantum circuit, by deleting all of the ineffective quantum gates. However, the modified quantum circuit is reprocessed by the simulated annealing which seeks to optimize the global metric of the circuit, i.e., to reduce the number of quantum gates. Thus, during the iteration of the steps S8 to S11, the simulated annealing can choose to modify quantum gates from the quantum circuit, which can decrease the local metric of the circuit but maximize the global metric of the quantum circuit. The use of the simulated annealing is, therefore, also particularly advantageous.

Then, at the determination step S12, if a minimum number of quantum swap gates is attained, or if a maximum number of iterations is attained, the quantum circuit is returned. This quantum circuit is compilable by the selected and optimized quantum processor.

If this is not the case, the method is repeated from the simulation step S8.

Figure 8:
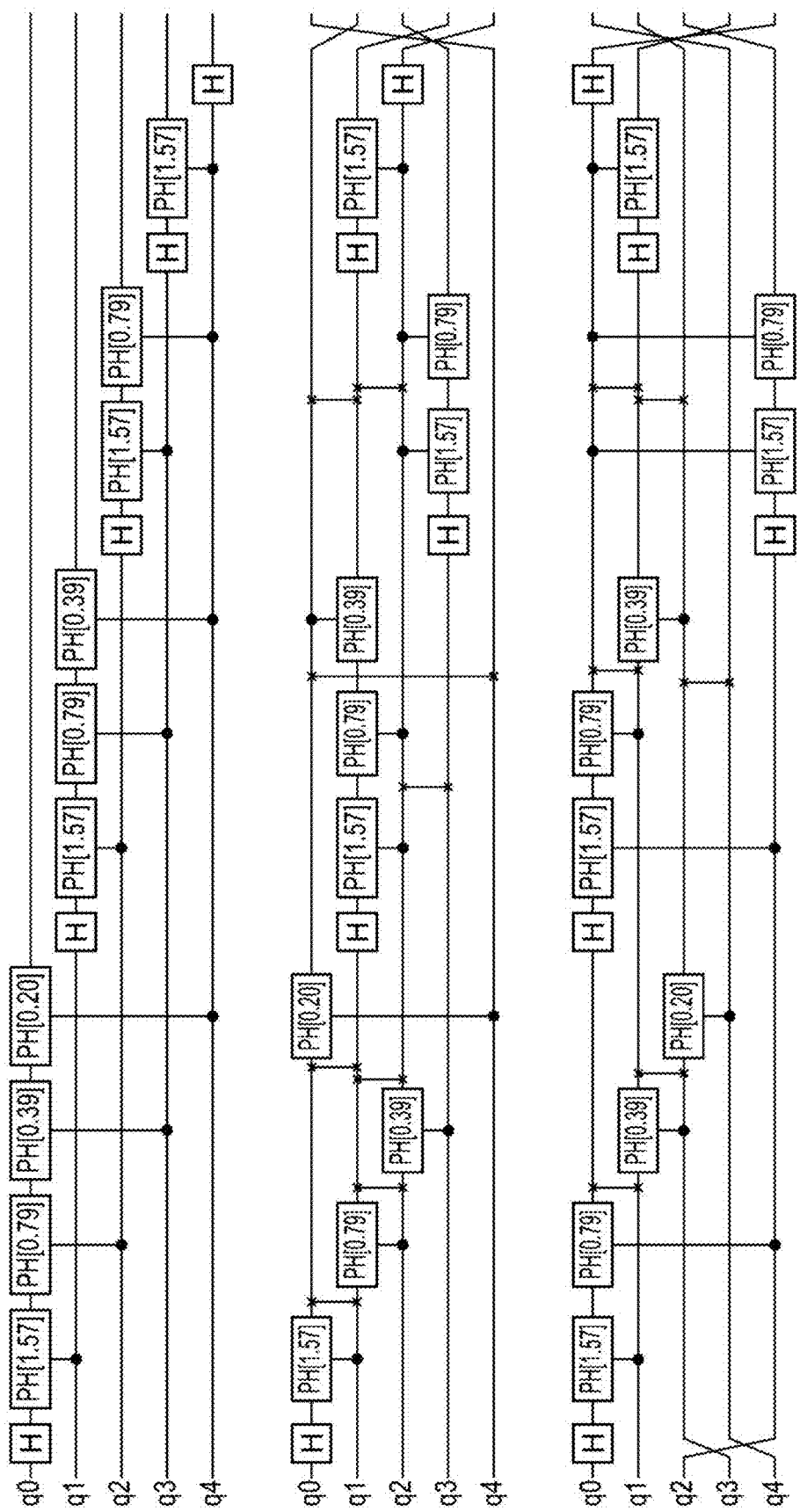
FIG. 8 shows another example of a quantum circuit compiled using an original circuit according to an example of the rules used for the re-writing of a quantum circuit according to the method and the compilation method of a quantum circuit on a quantum processor according to an embodiment of the invention.

FIG. 8 shows the quantum circuit at the different steps of the circuit. The first quantum circuit corresponds to the quantum circuit obtained at the simulation step S8. The second quantum circuit is the quantum circuit obtained after the local optimization, i.e., after the integration of the swap gates (insertion step S10). Finally, the last quantum circuit is obtained after the global optimization of the quantum circuit by the simulated annealing which makes it possible to remove two quantum swap gates, during the transformation step S11.

The table below shows the results of the method according to the invention in the case of the reduction of the number of quantum swap gates in relation to the prior art, for a quantum Fourier transformation at 10, 13, 16, 20 qubits.

TABLE 1

| | Prior Art | | Method according to the invention | | |
|---|---|---|---|---|---|
| | | | | | Number of swap gates when the method is stopped at 10% of the elapsed time. |
| Methods | Number of swap gates | Time (s) | Number of swap gates | Time (s) | |
| QFT 10 | 54 | 0.103 | 20 | 3.52 | 27 |
| QFT 13 | 96 | 0.036 | 32 | 7.23 | 41 |
| QFT 16 | 186 | 0.084 | 62 | 19.32 | 82 |
| QFT 20 | 372 | 0.102 | 103 | 33.46 | 119 |

Therefore, it appears that the minimization of the number of swap gates with the method according to the invention is much more effective than the method used in the prior art. Furthermore, since the method according to the invention is an anytime method, the method can be interrupted without losing the optimization already completed on the quantum circuit, an optimization i.e. already much more effective than the method of the prior art, even at 10% of the elapsed time.

However, the obtained quantum circuit comprises more quantum gates than the initial circuit. This is due specifically to the insertion of the quantum swap gates. As a result, those noise phenomena are amplified.

One of the sources of noise is the inactivity time of the qubits.

In order to reduce the inactivity of the qubits, it is possible to move certain quantum gates so that they fill the inactivity zones of the qubits.

The simulated annealing seeks therefore to maximize the global metric intending to reduce the inactivity time of the qubits in the quantum circuit. The local changes authorized by the quantum processor are defined. For example, such changes are the replacement of quantum sub-circuits by an equivalent quantum sub-circuit decreasing the inactivity time of the qubits.

A local metric, that the local search and local optimization seek to maximize, is to reduce the number of quantum gates in the quantum circuit.

Thus, the local search and the local optimization re-write quantum sub-circuits in order to locally reduce the number of quantum gates.

The simulated annealing effects a transformation of the quantum circuit obtained using these quantum sub-circuits in order to maximize the global metric.

LIST OF CITED DOCUMENTS

Non-Patent Literature

For all useful purposes, the following non-patent elements are cited:
nplcit1: Compiling SU(4) Quantum Circuits to IBM QX Architectures;
nplcit2: Rule-based optimization of reversible circuits.

The invention claimed is:

1. A method for developing a method for compiling a quantum circuit on a quantum processor, comprising:
a selection step:
of a quantum circuit,
of a quantum processor whereupon to compile the quantum circuit,
of a set of executable quantum gates on the selected quantum processor, based on the selected quantum processor,
of an optimization metric,
of a heuristic or meta-heuristic,
a step of division of the selected quantum circuit into quantum sub-circuits,
a first step of re-writing of the quantum sub-circuits comprising quantum gates that cannot be executed by the selected quantum processor so that they comprise only quantum gates that can be executed by the selected quantum processor,
a second step of re-writing of the quantum sub-circuits according to the selected heuristic or meta-heuristic, in order to obtain quantum sub-circuits comprising quantum gates that can be executed by the selected quantum processor, improving the selected metric,
a step of regrouping of the quantum sub-circuits in a quantum circuit compilable by the selected quantum processor.

2. The method for developing a method for compiling a quantum circuit on a quantum processor according to claim 1, wherein the second step of re-writing comprises:
an iteration loop subsequently comprising:
a step of obtaining of quantum sub-circuits resulting from the first step of re-writing,
a step of re-writing of said quantum sub-circuits into quantum sub-circuits comprising quantum gates that can be executed by the processor improving the selected metric,
a step of regrouping of the quantum sub-circuits to obtain a compilable quantum circuit,
a retroaction step, via the selected heuristic or meta-heuristic, resulting in a new step of re-writing of the quantum sub-circuits resulting from the first step of re-writing according to a selected metric score associated with the compilable quantum circuit, to attain:
either an extreme score threshold for the metric selected,
or a maximum threshold of iterations in the loop.

3. The method for developing a method for compiling a quantum circuit on a quantum processor according to claim 1, wherein:
a score equal to less than infinity is associated with the quantum gates that cannot be executed on the selected quantum processor,
a score equal to zero or to another constant value is associated with the quantum gates that can be executed on the selected quantum processor.

4. The method for developing a method for compiling a quantum circuit on a quantum processor according to claim 1, wherein the heuristic or meta-heuristic for optimization re-writes the quantum sub-circuits by:
changing a sequential order of the quantum gates of the quantum sub-circuits,
and/or merging several quantum gates into a single quantum gate,
and/or replacing the two-qubit quantum gates or more than two-qubits quantum gates with one-qubit quantum gates.

5. The method for developing a method for compiling a quantum circuit on a quantum processor according to claim 1, wherein the selected heuristic or meta-heuristic is a simulated annealing.

6. The method for developing a method for compiling a quantum circuit on a quantum processor according to claim 2, wherein:

the maximum threshold of iterations in the loop is pre-determined based on at least one selected quantum processor and/or quantum circuit.

7. A method for developing a method for compiling a quantum circuit on a quantum processor, comprising:

a selection step:

of a quantum circuit, of a quantum processor whereupon to compile the quantum circuit, of a set of executable quantum gates on the selected quantum processor, based on the selected quantum processor, a step of division of the selected quantum circuit into quantum sub-circuits, a first step of re-writing of the quantum sub-circuits comprising quantum gates that cannot be executed by the selected quantum processor so that they comprise only quantum gates that can be executed by the selected quantum processor, a second step of re-writing of the quantum sub-circuits by application of a simulated annealing, so as to obtain quantum sub-circuits comprising quantum gates that can be executed by the selected quantum processor, reducing a number of quantum gates, a step of regrouping of the quantum sub-circuits in a quantum circuit compilable by the selected quantum processor.

8. The method for developing a method for compiling a quantum circuit on a quantum processor according to claim 7, wherein the second step of re-writing comprises:

an iteration loop subsequently comprising:

a step of obtaining of quantum sub-circuits resulting from the first step of re-writing, a step of re-writing of said quantum sub-circuits into quantum sub-circuits comprising quantum gates that can be executed by the processor and reducing the number of quantum gates, a step of regrouping of the quantum sub-circuits to obtain a compilable quantum circuit, a retroaction step, via the simulated annealing, resulting in a new step of re-writing of the quantum sub-circuits resulting from the first re-writing step based on the number of quantum gates in the compilable quantum circuit, to attain:

either an extreme score threshold for the metric selected, or a maximum threshold of iterations in the loop.

9. The method for developing a method for compiling a quantum circuit on a quantum processor according to claim 8, wherein:

the maximum threshold of iterations in the loop is pre-determined based on at least one selected quantum processor and/or quantum circuit.

10. The method for developing a method for compiling a quantum circuit on a quantum processor according to claim 7, wherein:

a score equal to less than infinity is associated with the quantum gates that cannot be executed on the selected quantum processor, a score equal to zero or to another constant value is associated with the quantum gates that can be executed on the selected quantum processor.

11. The method for developing a method for compiling a quantum circuit on a quantum processor according to claim 7, wherein the simulated annealing re-writes the quantum sub-circuits by:

changing the sequential order of the quantum gates of the quantum sub-circuits, and/or merging several quantum gates into a single quantum gate, and/or replacing the one-qubit quantum gates or more than two-qubits quantum gates with one-qubit quantum gates.

12. A method for compiling a quantum circuit on a quantum processor by the use of a set of quantum gates that can be executed on the quantum processor, comprising:

a step of division of the selected quantum circuit into quantum sub-circuits, a first step of re-writing of the quantum sub-circuits comprising quantum gates that cannot be executed by the selected quantum processor so that they comprise only quantum gates that can be executed by the selected quantum processor, a second step of re-writing of the quantum sub-circuits according to a selected heuristic or meta-heuristic, in order to obtain quantum sub-circuits comprising quantum gates that can be executed by the selected quantum processor, improving a selected metric, a step of regrouping of the quantum sub-circuits in a compiled quantum circuit.

13. The method for compiling a quantum circuit on a quantum processor by the use of a set of quantum gates that can be executed on the quantum processor according to claim 12, wherein the second step of re-writing comprises:

an iteration loop subsequently comprising:

a step of obtaining of quantum sub-circuits resulting from the first step of re-writing, a step of re-writing of said quantum sub-circuits into quantum sub-circuits comprising quantum gates that can be executed by the processor improving the selected metric, a step of regrouping of the quantum sub-circuits to obtain a compiled quantum circuit, a retroaction step, via the selected heuristic or meta-heuristic, resulting in a new step of re-writing of the quantum sub-circuits based on a selected metric score, as a function of the compilable quantum circuit, to attain:

either an extreme score threshold for the metric selected, or a maximum threshold of iterations in the loop.

14. The method for compiling a quantum circuit on a quantum processor by the use of a set of quantum gates that can be executed on the quantum processor according to claim 13, wherein:

a score equal to less than infinity is associated with the quantum gates that cannot be executed on the selected quantum processor, a score equal to zero or to another constant value is associated with the quantum gates that can be executed on the selected quantum processor.

15. The method for compiling a quantum circuit on a quantum processor by the use of a set of quantum gates that can be executed on the quantum processor according to claim 12, wherein the heuristic or meta-heuristic for optimization re-writes the quantum sub-circuits by:

changing the sequential order of the quantum gates of the quantum sub-circuits, and/or merging several quantum gates into a single quantum gate, and/or replacing one-qubit quantum gates or more than two-qubits quantum gates with one-qubit quantum gates.

16. The method for compiling a quantum circuit on a quantum processor by the use of a set of quantum gates that can be executed on the quantum processor according to claim 12, wherein the heuristic or meta-heuristic is a simulated annealing.

17. A method for compiling a quantum circuit on a quantum processor by the use of a set of quantum gates that can be executed on the quantum processor, comprising:
- a step of division of the selected quantum circuit into quantum sub-circuits,
- a first step of re-writing of the quantum sub-circuits comprising quantum gates that cannot be executed by the selected quantum processor so that they comprise only quantum gates that can be executed by the selected quantum processor,
- a second step of re-writing of the quantum sub-circuits by application of a simulated annealing, so as to obtain quantum sub-circuits comprising quantum gates that can be executed by the selected quantum processor, reducing the number of quantum gates,
- a step of regrouping of the quantum sub-circuits in a compiled quantum circuit.

18. The method for compiling a quantum circuit on a quantum processor by the use of a set of quantum gates that can be executed on the quantum processor according to claim 17, wherein the second step of re-writing comprises:
an iteration loop subsequently comprising:
- a step of obtaining of quantum sub-circuits resulting from the first step of re-writing,
- a step of re-writing of said quantum sub-circuits into quantum sub-circuits comprising quantum gates that can be executed by the processor reducing the number of quantum gates,
- a step of regrouping of the quantum sub-circuits to obtain a compilable quantum circuit,
- a retroaction step, via the simulated annealing, resulting in a new step of re-writing the quantum sub-circuits based on the number of quantum gates in the compilable quantum circuit, to attain:
either an extremal score threshold for the metric selected,
or a maximum threshold of iterations in the loop.

19. The method for compiling a quantum circuit on a quantum processor by the use of a set of quantum gates that can be executed on the quantum processor according to claim 18, wherein:
the maximum iteration in the loop is predetermined.

20. The method for compiling a quantum circuit on a quantum processor by the use of a set of quantum gates that can be executed on the quantum processor according to claim 17, wherein the simulated annealing re-writes the quantum sub-circuits by:
- changing the sequential order of the quantum gates of the quantum sub-circuits,
- and/or merging several quantum gates into a single quantum gate,
- and/or replacing one-qubit quantum gates or more than two-qubits quantum gates with one-qubit quantum gates.

* * * * *